(12) United States Patent
Bulow et al.

(10) Patent No.: US 8,020,835 B2
(45) Date of Patent: Sep. 20, 2011

(54) DEVICE FOR INSTALLING AND REMOVING HIGH INSERTION FORCE MODULES

(75) Inventors: Jeff A. Bulow, Syracuse, NY (US); Stephen G. Race, Liverpool, NY (US); Budd S. Honda, Baldwinsville, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 969 days.

(21) Appl. No.: 11/982,594

(22) Filed: Nov. 2, 2007

(65) Prior Publication Data

US 2009/0115297 A1 May 7, 2009

(51) Int. Cl.
*B66F 11/00* (2006.01)
(52) U.S. Cl. ......... 254/131; 254/130; 254/134; 269/228
(58) Field of Classification Search .................. 254/131, 254/21, 25, 11, 26 E, 30, 130, 134; 269/3, 269/6, 228
See application file for complete search history.

(56) References Cited

U.S. PATENT DOCUMENTS

| 1,327,685 | A | * | 1/1920 | Page ............................. 254/130 |
| 2,676,784 | A | * | 4/1954 | Howard ........................ 254/17 |
| 4,597,173 | A | | 7/1986 | Chino et al. |
| 5,502,887 | A | | 4/1996 | Gonzales |
| 5,655,754 | A | * | 8/1997 | Perrier .......................... 254/384 |
| 5,926,370 | A | | 7/1999 | Cromwell |
| 5,934,649 | A | * | 8/1999 | Drane ............................ 254/30 |
| 6,170,803 | B1 | * | 1/2001 | Liberfarb ...................... 254/131 |
| 6,260,824 | B1 | * | 7/2001 | Aderhold ....................... 254/17 |
| 6,530,566 | B1 | * | 3/2003 | DuVernay ..................... 269/228 |
| 7,264,491 | B2 | | 9/2007 | McBroom et al. |
| 2009/0115297 | A1 | * | 5/2009 | Bulow et al. ................... 312/244 |

* cited by examiner

*Primary Examiner* — Lee D Wilson
(74) *Attorney, Agent, or Firm* — Howard IP Law Group, PC

(57) ABSTRACT

The present invention provides for electronic module insertion and removal such as when high insertion/extraction forces are exerted in small spaces. To secure or unsecure the module a frame is mounted to a cabinet housing the high insertion module. The frame includes a lever assembly that fixedly rotates about an axle attached at each end to a hub. The hub is allowed to rotate to one or more fixed angular positions that move the lever proximity relative to the front surface of the high insertion module. Applying a pressure to the lever rotates the lever until the module is either secured or unsecured from its cabinet.

24 Claims, 7 Drawing Sheets

DEVICE FOR INSTALLING AND REMOVING HIGH INSERTION FORCE MODULES

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. N00019-03-C-0057 awarded by the Naval Air Systems Command.

FIELD OF INVENTION

The present invention relates to the field of tools used in maintaining electrical system modules.

BACKGROUND

Installing and removing high insertion force modules in the interior spaces of aircraft often present problems due to the weight and the size of the modules relative to limited space. High insertion and extraction forces inherent in blind mate style connectors required by space constraints and modularized design require considerable pressure to both secure or unsecure the modules relative to their mounting structures. Consequently, the mechanics who insert and remove the equipment need to exert a force that often exceeds safety ergonomic standards, such as specified in MIL STD 1472F Human Factors. Few specialized devices exist for this activity and workers tend to substitute makeshift tools that are not entirely effective. When mechanics use tools such as screwdrivers or makeshift levers that are not designed for extracting and installing high insertion force modules, it risks both injury to the workers and damage to the equipment. The tight, small space that houses this equipment requires correspondingly slim line and small tools that do not supply the mechanical advantage necessary. Additionally, any solution to inserting and removing the modules must factor in the requirement for portability. Therefore, a need exists for a slim profile, portable tool or device for installing and removing high insertion force modules without damaging the internal electrical components or risking personal injury.

SUMMARY OF THE INVENTION

The present invention provides a push and pull capability by supplying a tool with a high mechanical advantage as required to install and remove high insertion force modules from an equipment cabinet, so as to require a maintenance worker to exert a force of less than or equal to the maximum allowed force specified by MIL STD 1472F for a similar task. One or more levers that push or pull the module mount and rotate about an axle fixed to an adjustable hub. The hub is adjustably secured to a stationary brace, which in turn is fixed to the frame that mounts on the module holding cabinet. Rotating the hub moves the location of the lever axis relative to the frame and thus the front surface of the cabinet housing the high insertion module. When the lever handle is rotated around the level axle, this action pulls or pushes the module from its seated position in the receiving fixture or into its seated position in the receiving fixture. The lever action, that is, the mechanical advantage produced by the lever is dependent on the angular position of the hub relative to the fixed brace.

Furthermore, the adjustable angular position of the hub allows a worker to select different mechanical advantages and a travel start and stop point for the pull and push action. The tool is designed to both fit the equipment cabinet and use its existing frame to mount the tool to allow the worker to accomplish the removal and replacement of the module in a constrained space, as for example an aircraft aisle or bulkhead. The tool effectively provides a portable, easy to use, ergonomic solution to the task of installing and removing the module without requiring design change to the electrical equipment, risking equipment damage, or potentially injuring the worker.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
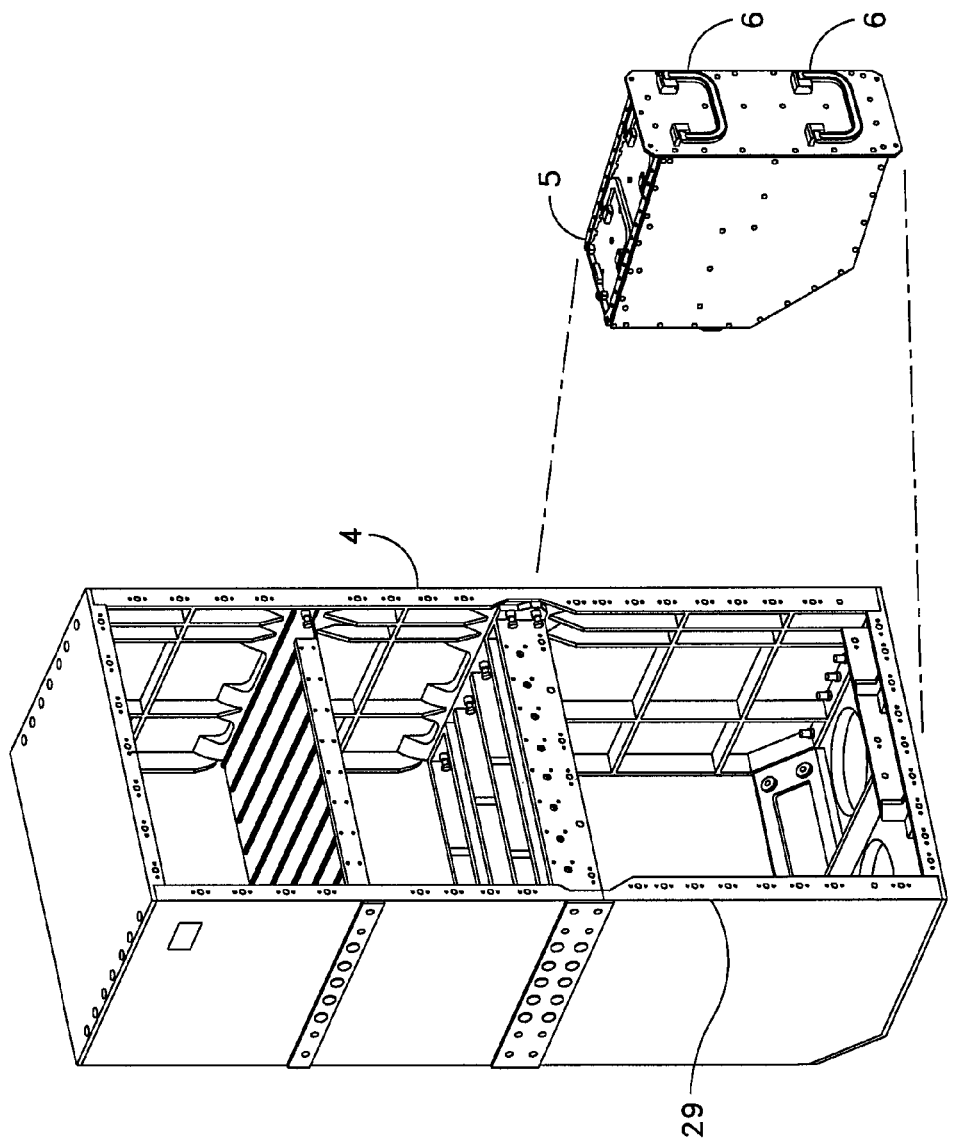
FIG. 1 is a perspective view of a portion of an aircraft rack, having an equipment bay and a high insertion module.
Figure 2:
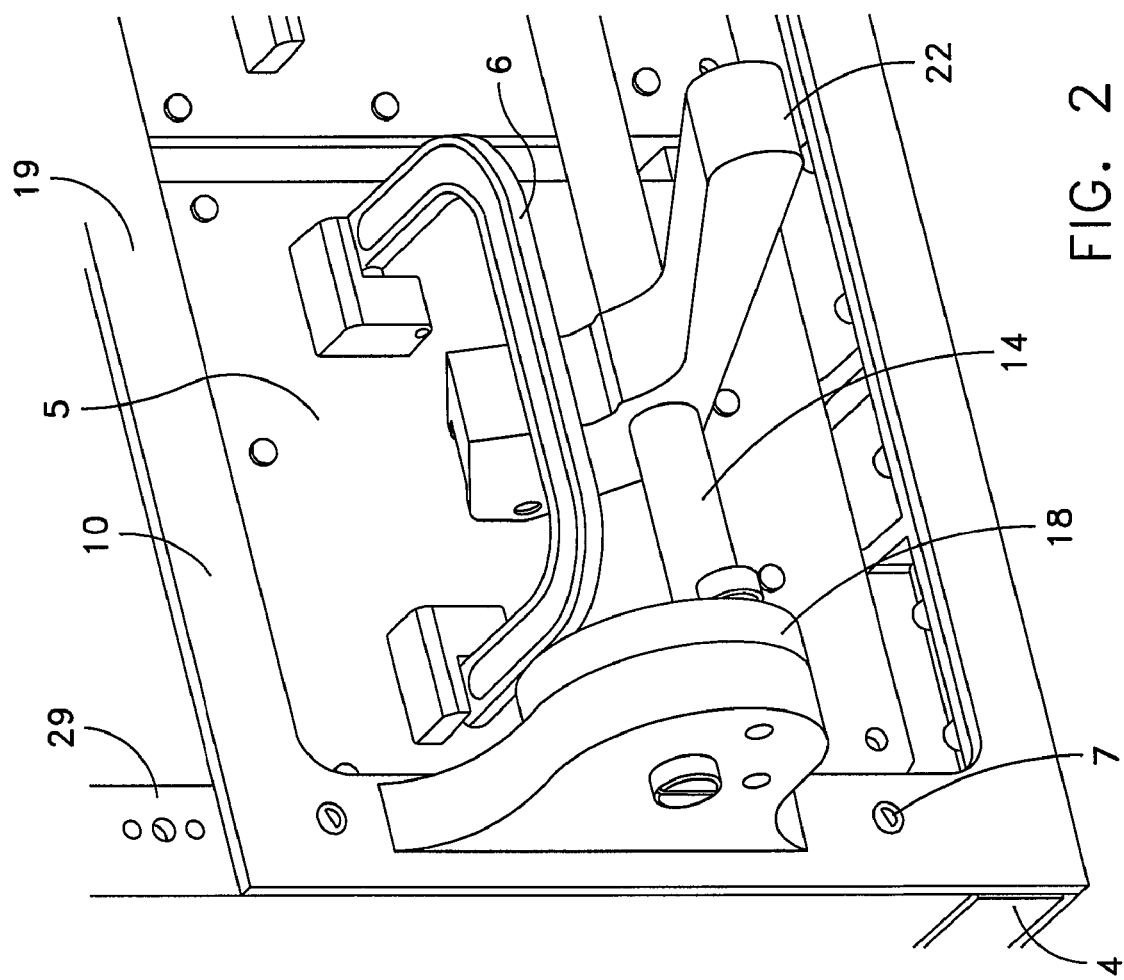
FIG. 2 is a perspective view of a tool for installing and removing a high insertion module in accordance with the present invention.

FIG. 1 illustrates an exemplary environment within which the invention may be used and comprises a cabinet 4 with a frame 29 and a high insertion module 5 with an associated handle 6. In one embodiment of the present invention as shown in FIG. 2, the tool 10 includes a frame 19 for fastening to cabinet 4 that encloses and supports the module 5. Multiple fasteners 7 firmly attach the frame 19 to a structural frame 29 of the cabinet 4. Held securely inside the cabinet 4 is the high insertion module 5. Lever 22 engages a handle 6 of the module 5 to secure the module's removal. In an installation mode, Lever 22 engages the front surface of module 5 to effect a pushing action. As will be further described below, the lever 22 may be placed in one of various orientations: (1) lateral movement along an axle 14 for optimum placement during the insertion or removal operation; (2) transverse movement when the position of axle 14 relative to a position of a hub 18 moves the axle 14 closer or further from the module 5; and (3) rotational movement about axle 14 to establish an optimum force for pulling or pushing the module 5. Each orientation contributes to achieving the mechanical advantage necessary to secure and unsecure the module 5 from cabinet 4 during its removal or installation.

Figure 3:
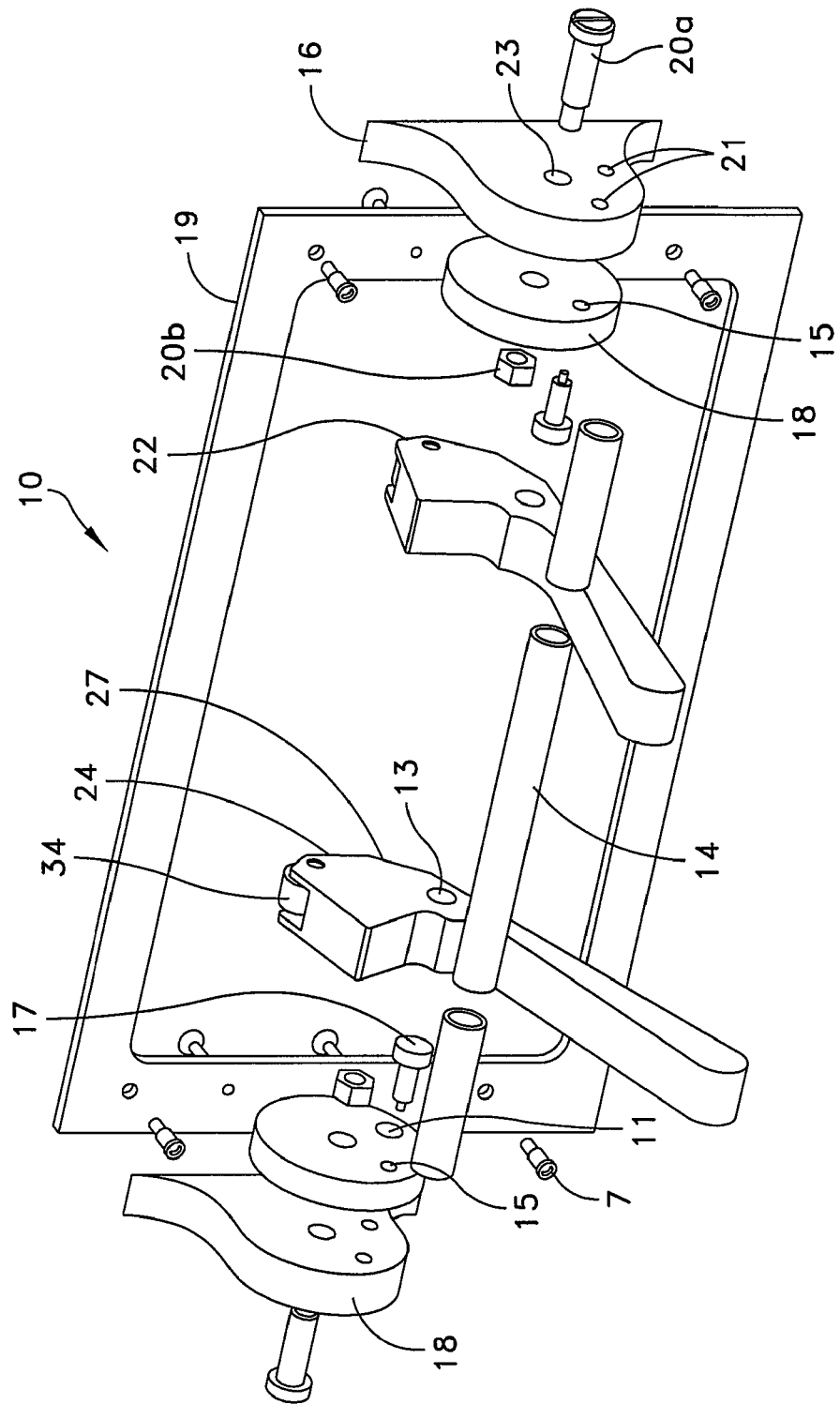
FIG. 3 is an exploded view of a tool for installing and removing a high insertion module in accordance with the present invention.

Referring to FIG. 3 the tool 10 may include one or more rotatable levers, such as lever 22 and 24, mounted through hole 13 on the axle 14. Each end of the axle 14 fixes to a pair of settable hubs 18 at two corresponding location holes 11 using an axle captive means such as a blind opening or alternative fastening device, each well known to those in the art of tool assembly. In turn, hub 18 is adjustably mounted to a brace 16 for a settable rotation about a central axis 23 using means well know to those in the art of tool assembly, such as a bearing (not shown), threaded shaft 20a and corresponding fastener 20b.

Prior to effectuating either a removal or insertion of the module 5 (FIG. 1), hub 18 is rotated upon the central axis 23 until a desired angular orientation is established, which is then set or fixed from further rotation through the insertion of a stop pin 17 into off-centered stop hole 15 that lines up with one of several corresponding holes 21 in brace 16. Any practical number of corresponding holes 21 in brace 16 may be incorporated into brace 16. Adjusting the angular position of hub 18 moves the axle 14 and its mounted levers 22, 24 in relative proximity to the module 5 front contact surface and/or its handle 6.

As further shown with reference to FIG. 1 and FIG. 3, to secure or unsecure the module 5 from the cabinet 4, a frame 19 is fixed to the cabinet 4 through a series of fasteners 7. The hub 18 angular rotation is set by pin 17 to secure the angular position of the hub 18 to the brace 16. Either or both the levers 22, 24 capture the handle 6 of module 5 for removal. To install the module 5 the levers 22, 24, surface 27 or roller surface 34 contact the front surface of module 5. A roller, or treated surface is preferred to minimize any potential for damage to module 5, but not necessary for function. In each instance, levers 22, 24 circle of rotation is dependent on the angular position of the hub 18 relative to the brace 16.

Figure 4:
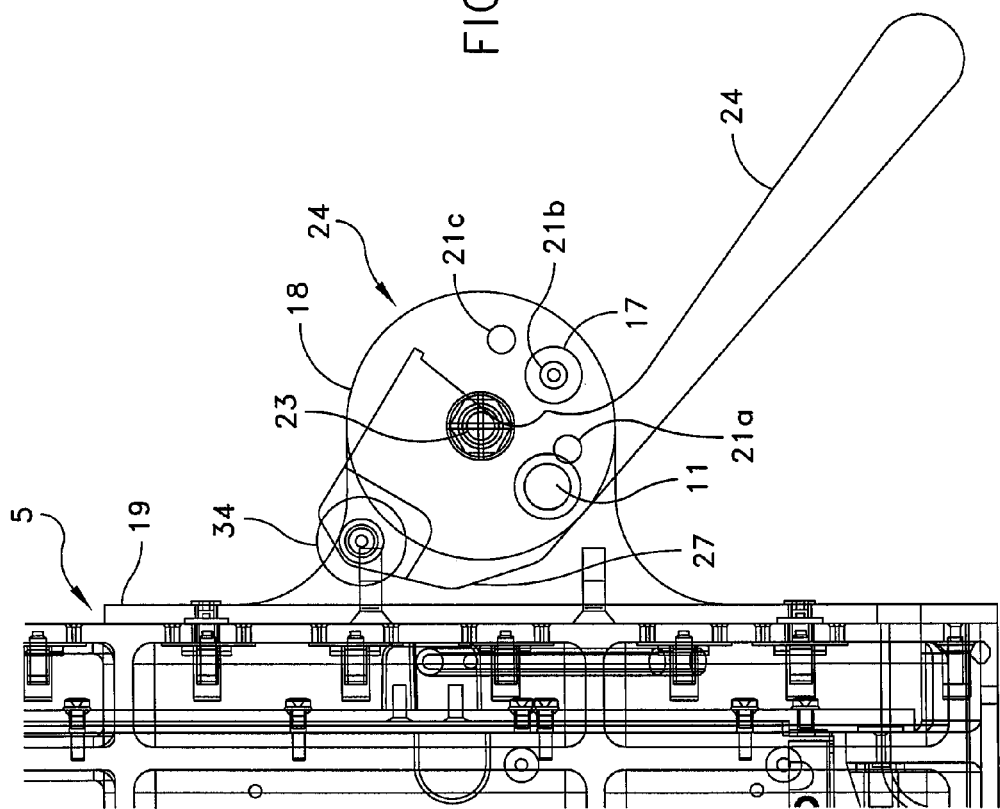
FIG. 4 is a plan side view of a tool for installing and removing a high insertion module in accordance with the present invention.

Referring to FIG. 4, lever 24 has at the distal end an optional slider or roller 34 either fixed or adjustable, so as to contact the front planar surface of the module 5 that is to be moved into place. Additionally, the lever 24 has one or more flat surfaces 27 that are used to apply pressure to the front surface of module 5 during insertion. FIG. 4 also illustrates the assembly of stop pin 17 into off-centered holes 21b, while holes 21a and 21c are shown unused.

Figure 5:
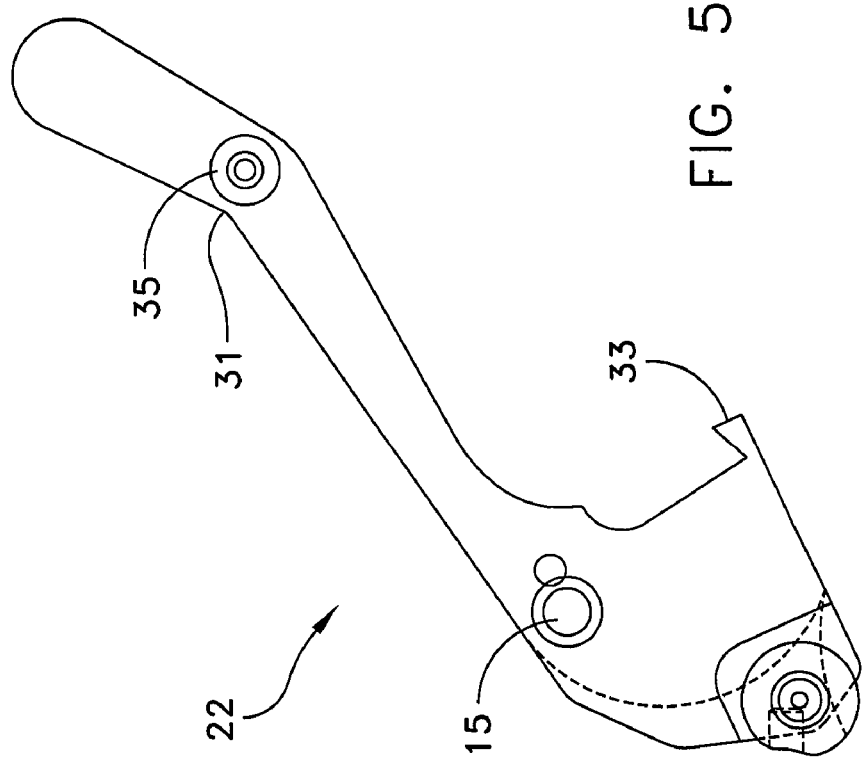
FIG. 5 is a plan side view of a lever for installing and removing a high insertion module in accordance with the present invention.

In FIG. 5 an alternate embodiment of the invention shows the orientation of the lever 22 flipped about the horizontal axis as contrasted in FIG. 4. A hook-like mechanism 33 may be utilized to fix the lever 22 to a corresponding mechanism on the module 5, such as handle 6. Further embodiments of lever 22 include an adjustable arm 31 that may be implemented utilizing a lockable or ratchetable socket arrangement such as socket 35 or other means well known by those skilled in the art.

Figure 6:
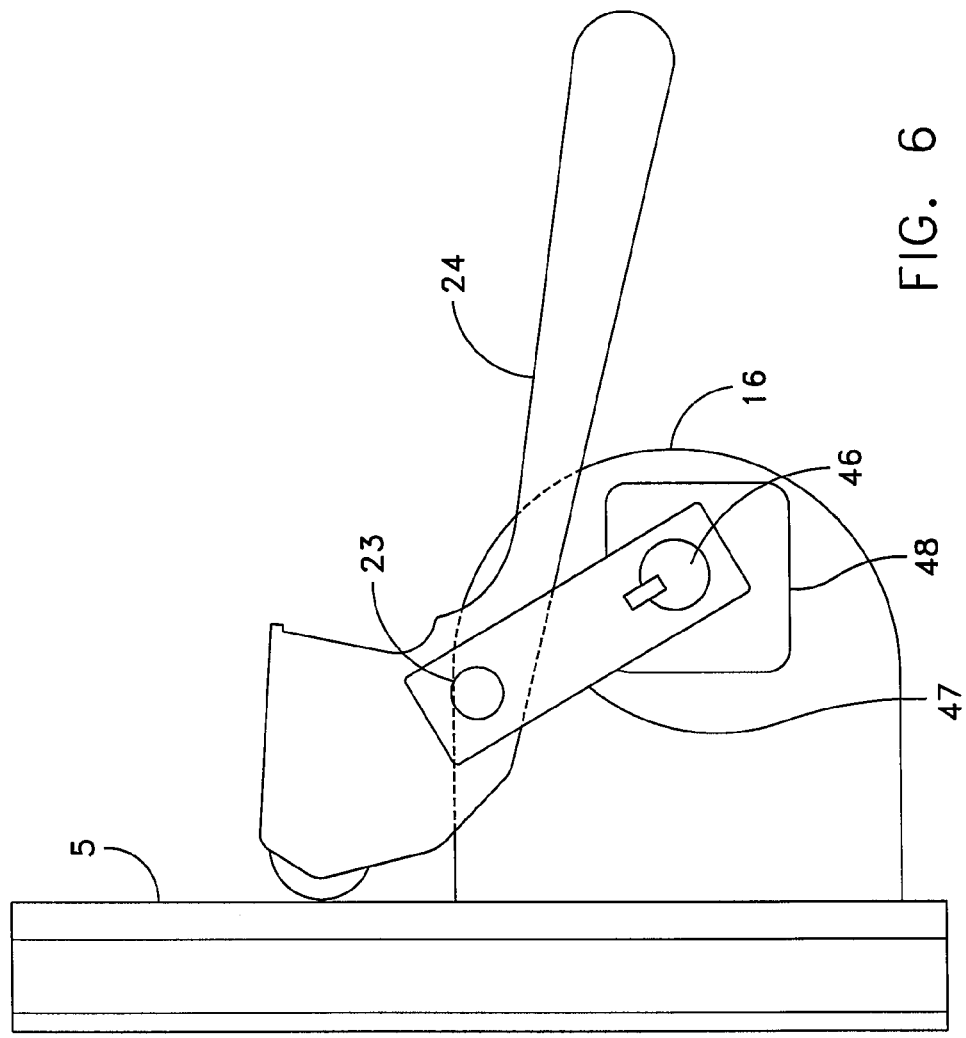
FIG. 6 is a plan side view of a lever for installing and removing a high insertion module in accordance with the present invention.
Figure 7:
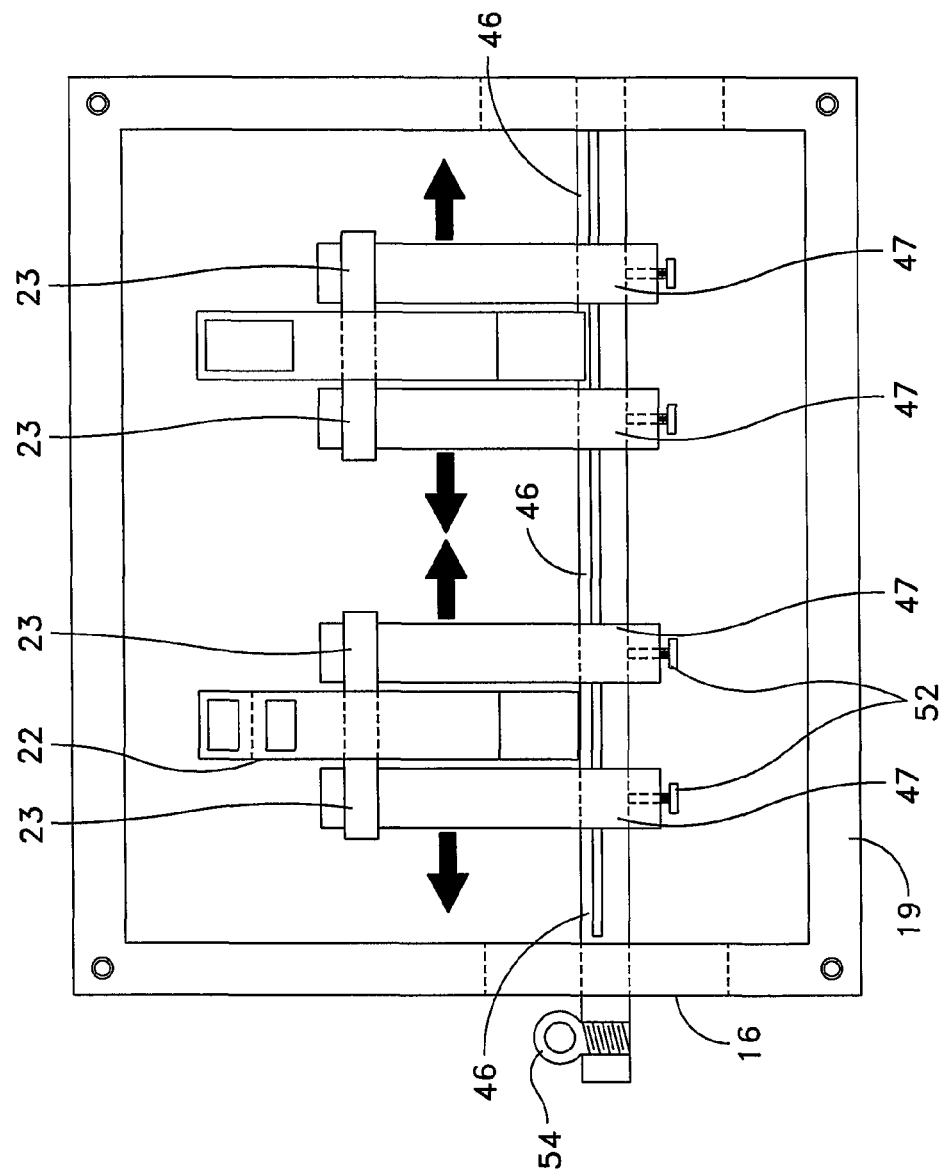
FIG. 7 is a plan front view of a tool for installing and removing a high insertion module in accordance with the present invention.

FIG. 6 and FIG. 7 illustrate an alternate embodiment of the invention whereby the lever 24 has a pair of offset radial swing arms 47 that adjust the lever pivot point 23 and therefore the mechanical advantage of the lever 24 with respect to the force applied to the module 5. An alternate design making use of a single, or multiple (more than two) rotary swing arms 47 is also possible, this disclosure has elected to specify two rotary swing arms 47 as the preferred design. The swing arms 47 are rotatably secured to the lever pivot point 23. The swing arms 47 are also secured to the proximity adjustment axle 46 such that they cannot rotate freely around the proximity adjustment axle due to the spline, but they can axially slide along the proximity adjustment.

The proximity adjustment axle 46 is rotatably secured by the support structure bracket 16 and is angularly oriented with respect to the pivot point 23 though a turning means such as worm gear 48 that fixes the spline radial position on the axle 46. Although those skilled in the art of mechanical design will appreciate different mechanisms to adjust the spline position, in one non limiting example, rotating hex adjustment 54 rotates the worm gear 48, which in turn rotates the proximity adjustment axle 46, which provides for a substantially continuous adjustment of the position between the lever 24 and the module 5. Once the proximity adjustment axle 46 is oriented radial swing arm position stop means such as set screws 52 fix the position of swing arms 47 with respect to the proximity adjustment axle 46.

An embodiment of the present invention also includes a method for installing a high insertion module 5 comprising the steps of initially positioning, but not firmly installing or fixedly securing the module 5 in the cabinet 4; fixing tool 10 to frame 19 of holding cabinet 4; setting the hub 18 to an angular position defining the proximity of a lever to an item to be installed; contacting the front surface of the module 5 with the distal end 27 or 34 of the lever 24; applying a pressure to the lever 24 to move the lever 24 through a rotation dependent on the angular position of the hub 18 until the module 5 is firmly installed into the cabinet 4.

An embodiment of the present invention also includes a method for removing a high insertion module 5 comprising the steps of fixing tool 10 to frame 19 of holding cabinet 4; setting a hub 18 to an angular position; securing the lever 24 to the module; applying a pressure to the lever 24 to move the lever through a rotation dependent on the angular position of the hub 18 until the module 5 is unsecured from the cabinet 4.

While the foregoing invention has been described with reference to the above-described embodiment, various modifications and changes can be made without departing from the spirit of the invention. Accordingly, all such modifications and changes are considered to be within the scope of the invention.

We claim:

1. A device for inserting and removing a module from a cabinet comprising:
   one or more levers rotatable around an axle; the axle fixed at an end to a hub, the hub rotatable around a first axis, wherein the axle is arranged along a second axis radially offset from the first axis such that rotating the hub moves the axle relative to a front surface the module.

2. The device of claim 1 wherein the one or more levers have a multiplicity of orientations.

3. The device of claim 2 wherein the one or more levers provides for lateral movement along the axle for optimum placement during the insertion or removal operation.

4. The device of claim 2 wherein the one or more levers provides for transverse movement relative to a position of the hub.

5. The device of claim 2 wherein the one or more levers provides for rotational movement about the axle to establish an optimum force for pulling or pushing the module.

6. The device of claim 2 wherein the one or more levers provides for rotational movement about an offset pivot point on an adjustable means to establish an optimum force for pulling or pushing the module.

7. The device of claim 1 wherein the axle substantially parallels the front surface of the module.

8. The device of claim 1 wherein to insert or remove the module the device is mounted to the cabinet.

9. The device of claim 1 wherein the proximity of the axle to the front surface of the module is adjustable.

10. The device of claim 9 wherein the adjustment is provided by an attachment at each end to the rotatable hub.

11. The device of claim 9 wherein the adjustment is provided by repositioning one or more rotatable means.

12. The device of claim 1 wherein the hub rotates about a central point.

13. The device of claim 1 wherein the hub angular rotation may be locked or adjusted and fixed to one or more fixed positions.

14. The device of claim 13 wherein the angular rotation is fixed by a pin that fastens the hub to a member.

15. The device of claim 14 wherein member is fixed relative to the position of a frame of the device.

16. The device of claim 13 wherein the lever circle of rotation is dependent on the angular position of the hub relative to the fixed member.

17. The device of claim 1 wherein the lever is adjustable.

18. The device of claim 1 wherein the lever has a hook that secures a corresponding mechanism on the module.

19. A method for installing a module comprising the steps of initially positioning, but not fixedly securing the module into a holding cabinet; fixing a tool to a frame of the holding cabinet; setting a rotatable hub to a fixed angular position around a first axis defining the proximity of a lever to an item to be installed; contacting the front surface of the module with the lever; applying a pressure to the lever to rotate the lever around a second axis until the module is firmly secured into the cabinet, wherein the second axis is radially offset from the first axis.

20. A method for removing a module comprising the steps of fixing a tool to a frame a of a holding cabinet; setting a hub to a fixed angular position around a first axis; contacting a lever to the module; applying a pressure to the lever to rotate the lever around a second axis until the module is unsecured from the cabinet, wherein the second axis is radially offset from the first axis.

21. A device for inserting and removing a module from a cabinet comprising: one or more levers fixedly rotatable about pivot points arranged along a first axis; each said pivot point fixed to an associated arm rotatable around a second axis radially offset from the first axis, wherein rotating the position of an associated rotatable arm around the second axis positions the associated lever with respect to the module.

22. The device of claim 21 wherein the one or more levers has a pair of offset radial swing arms that adjust the pivot point.

23. The device of claim 22 wherein each swing arm is rotatably secured to the lever pivot point and to a splined radial proximity adjustment axle.

24. The device of claim 23 wherein the proximity adjustment axle is oriented with respect to the pivot point though a means that fixes the splined radial position on the proximity adjustment axle.

* * * * *